United States Patent
McCune

(10) Patent No.: US 7,702,300 B1
(45) Date of Patent: Apr. 20, 2010

(54) ENVELOPE MODULATOR SATURATION DETECTION USING A DC-DC CONVERTER

(75) Inventor: Earl W. McCune, Santa Clara, CA (US)

(73) Assignee: Panasonic Corporation, Osaka (JP)

(*) Notice: Subject to any disclaimer, the term of this patent is extended or adjusted under 35 U.S.C. 154(b) by 501 days.

(21) Appl. No.: 11/827,859

(22) Filed: Jul. 12, 2007

(51) Int. Cl.
   *H04B 1/04* (2006.01)

(52) U.S. Cl. ..................... 455/108; 455/126

(58) Field of Classification Search ............ 455/91, 455/95, 102, 106, 107, 108, 114.1, 125, 126, 455/127.1; 330/10, 129, 136, 279, 285
See application file for complete search history.

(56) References Cited

U.S. PATENT DOCUMENTS

| | | | |
|---|---|---|---|
| 4,355,303 A | 10/1982 | Phillips et al. | 340/310 A |
| 4,503,398 A | 3/1985 | Akram | |
| 5,079,497 A | 1/1992 | Barbu et al. | 323/381 |
| 5,175,879 A | 12/1992 | Ellingson et al. | 455/341 |
| 5,302,913 A | 4/1994 | Hori | 330/129 |
| 5,432,473 A | 7/1995 | Mattila et al. | |
| 5,548,205 A | 8/1996 | Monticelli | 323/274 |
| 5,564,087 A | 10/1996 | Cygan et al. | 455/126 |
| 5,589,796 A | 12/1996 | Alberth, Jr. et al. | |
| 5,942,946 A | 8/1999 | Su et al. | |
| 6,173,056 B1 | 1/2001 | Romesburg et al. | |
| 6,236,266 B1 | 5/2001 | Choumei et al. | |
| 6,351,189 B1 | 2/2002 | Hirvilampi | |
| 6,430,402 B1 | 8/2002 | Atgahi-Kesheh | |
| 6,528,975 B2 | 3/2003 | Sander | 323/281 |
| 6,566,944 B1* | 5/2003 | Pehlke et al. | 330/10 |
| 6,639,466 B2 | 10/2003 | Johnson | |
| 6,651,021 B2 | 11/2003 | Underbrink et al. | |
| 6,882,220 B2 | 4/2005 | Doherty et al. | |
| 7,091,790 B2 | 8/2006 | Doherty et al. | |
| 7,123,095 B2 | 10/2006 | Tsutsui et al. | |
| 7,193,471 B2 | 3/2007 | Tsutsui et al. | |
| 2008/0026706 A1* | 1/2008 | Shimizu et al. | 455/108 |

\* cited by examiner

*Primary Examiner*—Thanh C Le

(57) ABSTRACT

In an embodiment of the invention, a system provides for efficient polar and linear signal modulation. The system has a controller coupled to a voltage converter and a modulator. The system also has an amplifier coupled to the voltage converter and the phase modulator. The controller is for receiving an input and providing a polar signal. The voltage converter is for receiving the polar signal, receiving a voltage input, and providing a power signal. The amplifier is for amplifying the modulated signal based on the power signal. The voltage converter provides a feedback signal to the controller, and the controller adjusts a scale of modulation, such as a peak of the modulation signal, based on the feedback signal, such that the output power and the amplification by the amplifier are based on the feedback signal.

47 Claims, 5 Drawing Sheets

ENVELOPE MODULATOR SATURATION DETECTION USING A DC-DC CONVERTER

FIELD OF THE INVENTION

The present invention relates to the field of modulators. More specifically the present invention relates to efficient modulation.

BACKGROUND

In recent years, researchers have proposed and implemented so called "polar" architectures for the improved transmission of signals. These polar architectures, rather than using complex In-phase Quadrature (IQ) components of a data signal, operate by using the polar components of the data signal. Accordingly, polar implementations of modulation circuitry are used to transmit and receive voice and/or data in the radio frequency (RF) bands of the communications spectrum. Polar implementations have a number of advantages over their IQ counterparts.

However, polar implementations have drawbacks as well. For instance, polar envelope modulation (EM) circuitry typically has no direct visibility of the supply voltage on the envelope modulation driver. Hence, if the supply power is low, such as in low battery situations, for example, then distortion will occur for high envelope power peaks. Moreover, the power amplifier of the envelope modulation circuitry tends to operate in an inefficient range in these situations. This further causes excessive power consumption by the amplifier, which exasperates the low supply power and/or low battery condition.

Some attempts have been made to solve this problem. For instance, some researchers have attempted to solve the problem by first determining situations in which a low battery condition is to be generally expected. Then, for these situations, a margin of power reduction is built into the supply power of the transmitter design. The power reduction margin lowers the nominal output power $P_{out}$, which reduces communication coverage and corresponds to lower service quality.

SUMMARY OF THE INVENTION

One aspect of the invention includes a method of providing efficient signal modulation. The method receives a polar signal and provides it to a switching module. The switching module has a voltage input. The method provides a feed back signal from the switching module. In some embodiments, the feed back signal is based on a duty cycle. In some embodiments, the feedback signal is based on voltage differences or voltage ratios. The method adjusts a modulation scale or a peak of the modulation signal, based on the feedback signal.

Another aspect of the invention includes a system that provides for efficient polar signal modulation. The system has a controller coupled to a voltage converter and a phase modulator. The system also has an amplifier coupled to the voltage converter and the phase modulator. The controller is for receiving an input and outputting a polar signal. The voltage converter is for receiving the polar signal, receiving a voltage input, and outputting a power signal. The phase modulator is for receiving a phase angle θ, receiving a phase modulation $\omega_c$, and outputting a phase modulated signal. The amplifier is for amplifying the phase modulated signal based on the power signal. The voltage converter provides a feedback signal to the controller, and the controller adjusts a modulation scale or a peak of the modulation signal, based on the feedback signal, such that the output power and the amplification by the amplifier are based on the feedback signal. In some embodiments, the phase modulator is replaced by a quadrature modulator, which receives an in-phase signal component I and a quadrature signal component Q from the controller, and provides the input to the power amplifier.

Adjusting the modulation scale, in some embodiments, includes modifying the polar signal. Some embodiments generate the polar signal from an input signal. The input signal of these embodiments includes analog and/or digital signals. Some embodiments then amplify the polar signal based on the voltage input. Additionally, some embodiments modify a phase of the polar signal. These, and other embodiments, generate an RF signal for transmission.

The voltage input preferably indicates a low battery condition, and the feedback signal indicates when the voltage input comprises a low signal. In these embodiments, the polar signal is modified based on the feedback signal, and, hence, the feedback signal provides for efficient modulation of the polar signal. The modulation comprises amplitude and/or phase modulation.

BRIEF DESCRIPTION OF THE DRAWINGS

The present application is described relative to the several views of the drawings. Where appropriate and only where identical elements are disclosed and shown in more than one drawing, the same reference numeral will be used to represent such identical elements.

DETAILED DESCRIPTION

Figure 1:
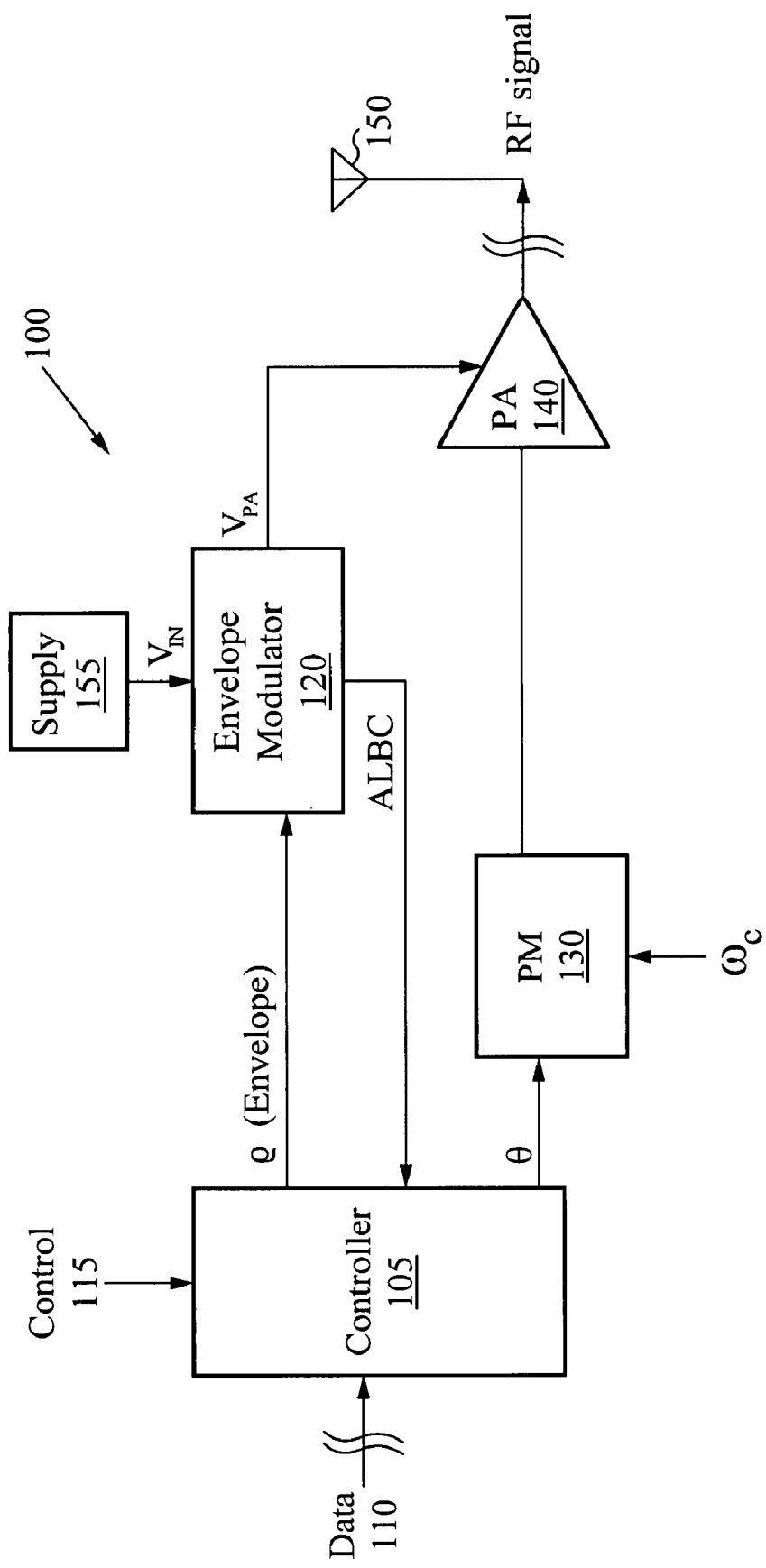
FIG. 1 illustrates a modulation circuit of the prior art with low battery compensation.

Embodiments of the present application are described herein in the context of an apparatus and method for efficient envelope modulation. Those of ordinary skill in the art will realize that the following detailed description of the present application is illustrative only and is not intended to be in any way limiting. Other embodiments of the present application will readily suggest themselves to such skilled persons having the benefit of this disclosure.

Reference will now be made in detail to implementations of the present application as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present application, some of the components, process steps, and/or data structures may be implemented using various types of digital systems, including hardware, software, or any combination thereof. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

In previous implementations of Automatic Low Battery Compensation (ALBC) the onset of saturation is sensed in the pass transistor of a linear envelope modulator (LEM). One such implementation is taught in U.S. Pat. No. 6,528,975. These automatic low battery compensation implementations provide some amount of control for the linear envelope modulator. Specifically, when the monitored transistor approaches saturation, the linear modulator circuit "backs off." Backing off typically comprises reducing the amount of amplitude modulation, to keep the LEM operating in the linear region.

Automatic low battery compensation circuits were developed for the conventional (linear) modulation circuits in consideration of the constraints described above. Some of these ALBC circuits employ a sense line and a comparator. If the comparator determines that a signal value on the sense line approaches an operating limit, a feedback signal is sent to a controller for the envelope modulation circuit. The feedback signal preferably contains information that causes the modulation circuit to reduce the magnitude of the envelope modulation (to back off) until the operating limit is again met. Then, the monitored signal on the sense line typically returns to a predetermined range. As suggested above, these ALBC circuits are traditionally used to keep the LEM operating in its linear region.

One such implementation of a modulation circuit with low battery compensation of the prior art is illustrated in FIG. 1. As shown in FIG. 1, an exemplary modulation circuit 100 includes a controller 105 that is coupled to an envelope modulator 120 and a phase modulator 130, which are in turn coupled to one or more amplifiers 140. The controller 105 typically receives data at a data input 110 and control signals at a control input 115. The control signals typically include information regarding frequency, power and other modulation parameters for the modulation circuit 100.

The controller 105 further has (polar) outputs ρ and θ. The output ρ represents the magnitude, in polar coordinate form, of an envelope or message signal received by the controller 105 at the data input 110. The output ρ is used for performing amplitude and/or envelope modulation for the message signal. Similarly, the output θ represents the phase angle of the message signal, in polar coordinate form. The output θ of the controller 105 is used to perform phase modulation for the message signal.

The controller 105 provides the output ρ to the envelope modulator 120. The envelope modulator 120 also receives a voltage input $V_{IN}$ from a voltage source 155. Then, based on the voltage input $V_{IN}$ and the signal ρ, the envelope modulator 120 provides a voltage signal $V_{PA}$ to the supply input of the power amplifier 140. The output of the power amplifier 140 is an amplified and phase modulated radio frequency (RF) signal that is suitable for transmission. This RF signal may then be provided to additional circuitry such as an additional amplifier for further amplification (as is the case in an amplifier module), or typically to one or more antennae 150 for transmission.

The voltage signal $V_{PA}$ has to be lower than the voltage signal $V_{IN}$ provided from the voltage source 155. The input voltage signal $V_{IN}$ provided to the envelope modulator 120 is typically associated with a limited and/or portable power supply 155, such as a battery, for example. As the battery is discharged, and the input voltage signal $V_{IN}$ sags, distortion can occur if the signals are not adjusted. Accordingly, before distortion begins, an automatic low battery compensation (ALBC) signal is generated by the envelope modulator 120 and provided to the controller 105. In response to the automatic low battery compensation signal ALBC, the controller 105 reduces the peak of the output signal ρ, in order to reduce the peak of the envelope and thereby both reduce distortion and conserve power within the modulation circuit. When the battery 155 is charged, operation of the modulation circuit reverts to normal operation.

To improve efficiency of the modulation circuit, if the envelope values are not very high, it is desirable to drop the input voltage signal $V_{IN}$ from the power supply to a level closer to the actual peak of the envelope signals. If realized using linear techniques this can result in the loss of a fair amount of overhead and the generation of heat, which negatively effects the life of the battery.

Figure 2:
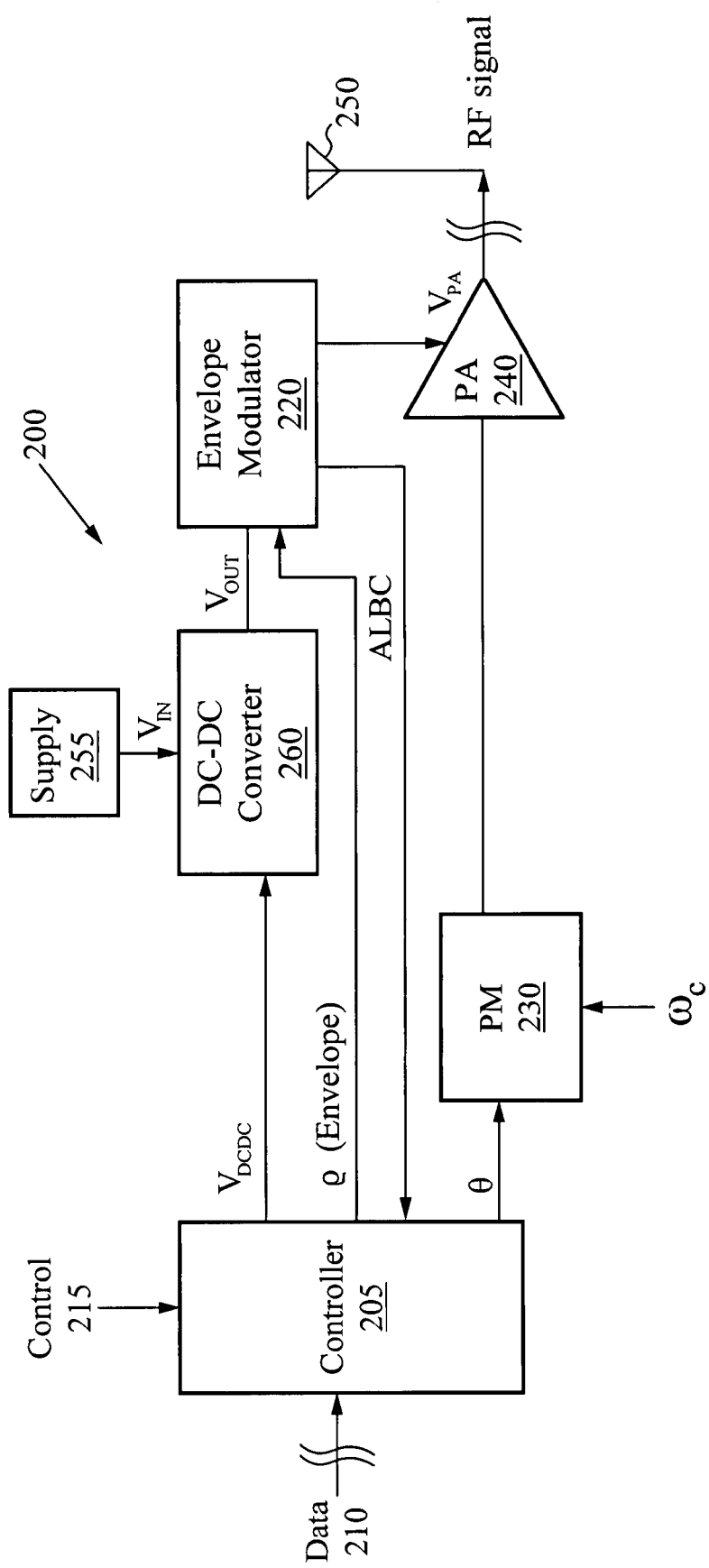
FIG. 2 illustrates a modulation circuit with a DC-DC converter.

In order to efficiently convert the supply voltage signal $V_{IN}$ to another voltage provided to the envelope modulation circuit, a DC-DC converter is added between the power supply and the envelope modulator, as illustrated in FIG. 2. As shown in FIG. 2, an exemplary modulation circuit 200 includes a controller 205 that is coupled to a DC-DC converter 260, an envelope modulator 220 and a phase modulator 230. The envelope modulator 220 and the phase modulator 230 are in turn coupled to one or more amplifiers 240. The controller 205 typically receives data at a data input 210 and control signals at a control input 215. As described above, the control signals typically include information regarding frequency, power and other modulation parameters for the modulation circuit 200.

As described above, the controller 205 provides the polar output signals ρ and θ. The output signal ρ represents the magnitude, in polar coordinate form, of an envelope or message signal received by the controller 205 at the data input 210. The output signal ρ is used for performing amplitude and/or envelope modulation for the message signal. Similarly, the output signal θ represents the phase angle of the message signal, in polar coordinate form. The output signal θ of the controller 205 is used to perform phase modulation for the message signal.

The output of the power amplifier 240 is an amplified and phase modulated radio frequency (RF) signal that is suitable for transmission. This RF signal may then be provided to additional circuitry such as an additional amplifier for further amplification (as is the case in an amplifier module), or typically to one or more antennae 250 for transmission.

The modulation circuit 200 of FIG. 2 also includes another control signal $V_{DCDC}$ provided from the controller 205 to the DC-DC converter 260. The control signal $V_{DCDC}$ is provided to the DC-DC converter 260 to control the voltage output from the DC-DC converter 260 to the envelope modulator 220. This breaks the connection between the envelope modulator 220 and the level of the input voltage signal $V_{IN}$ from the power supply 255, removing the responsibility for monitoring the level of the input voltage signal $V_{IN}$ from the envelope modulator 220. However, this also reduces the effectiveness of the automatic low battery compensation signal ALBC provided from the envelope modulator 220 to the controller 205.

In order to implement low battery compensation in an envelope modulation circuit with a DC-DC converter, the DC-DC converter, which is coupled to and has visibility of the power supply, now needs to have responsibility for providing the low battery compensation signal ALBC. For circuit designs where the DC-DC converter is the entire envelope modulator, the approach is particularly different from the automatic low battery compensation implementations mentioned above.

For instance, some embodiments provide a method to sense when a DC-DC converter is approaching "saturation," such as, for example, when an output voltage $V_{out}$ approaches an input voltage $V_{in}$ of the converter. Some of these embodiments perform the sensing by monitoring the switching duty cycle of the DC-DC converter. More specifically, these embodiments operate by using the basic DC-DC converter relationship:

$$V_{out} \approx V_{in} \cdot D, \text{ where } 0 \leq D < 1 \quad \text{equation (1)}$$

In this equation (1), "D" is the long term average switching duty cycle, $V_{out}$ is the output voltage provided by the DC-DC converter, and $V_{in}$ is the input voltage provided to the DC-DC converter. In some embodiments, $V_{in}$ is the voltage of a battery that provides power to the entire modulation circuit, including the power amplifier.

Thus, to perform automatic low battery compensation for the polar modulation circuits described above, some embodiments monitor the duty cycle of the DC-DC converter. If the duty cycle "D" reaches an operating limit, or a threshold "$D_0$," (such that $D>D_0$), a feedback signal is sent to a controller for the envelope modulation circuit. The feedback signal preferably contains information and/or a message that causes the modulation circuit to reduce the magnitude of the envelope modulation (to back off) until the operating limit is again met. Then, when the monitored duty cycle returns to a predetermined range, some embodiments employ conventional probing techniques to remove any back off that is in effect. Hence, one of ordinary skill recognizes that by matching the predetermined range to the appropriate application, these embodiments provide power efficiency to the modulation circuit.

Moreover, the relationship given by the equation (1) generally holds true whether conventional pulse width modulation (PWM) or sigma-delta (ΣΔ) modulation is used to drive the switching of the DC-DC voltage converter. Thus, some embodiments of the invention are robust and provide efficient power control regardless of the type of modulation, the type of amplifier, and/or the operating mode of the amplifier.

Figure 3:
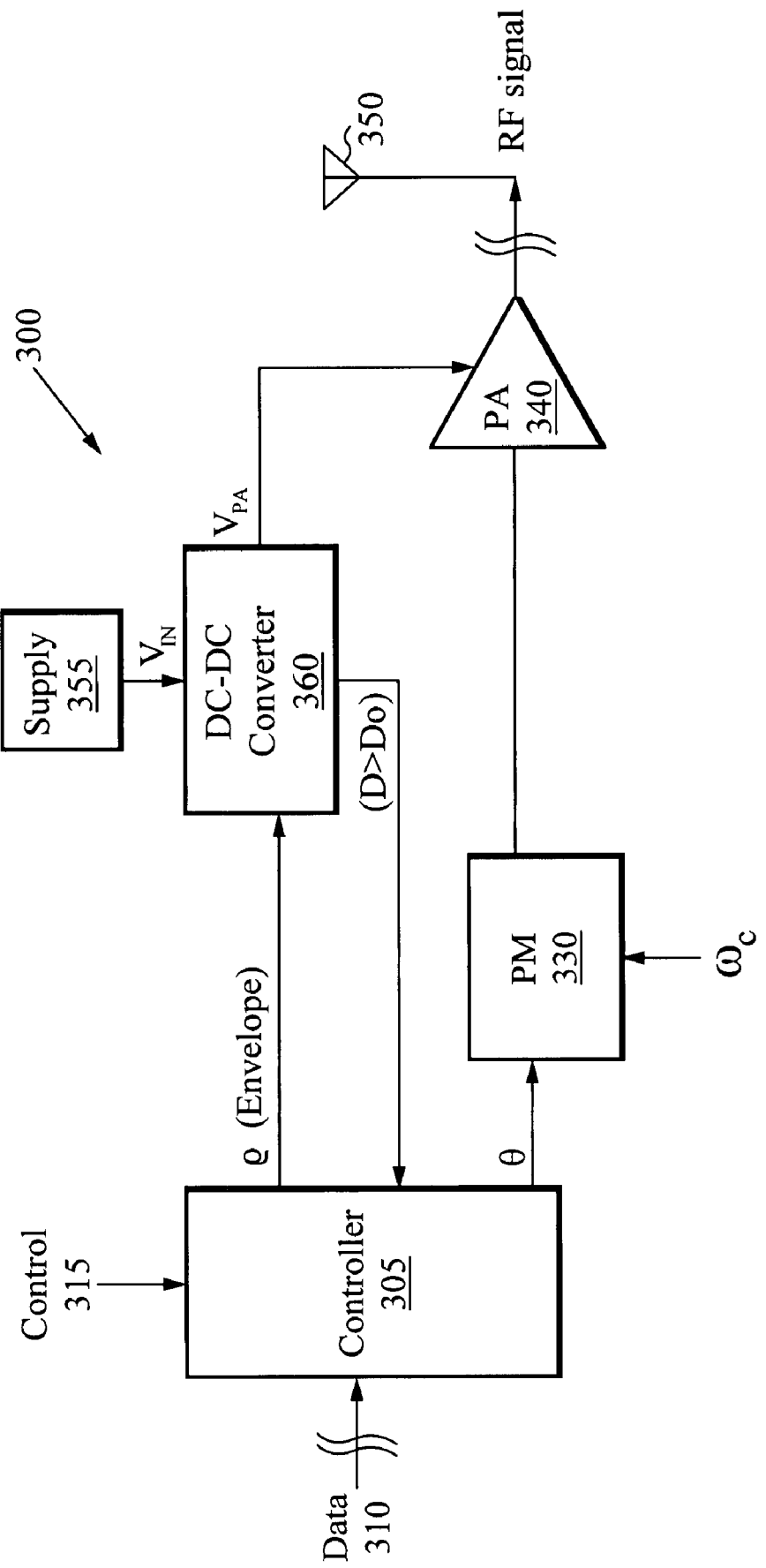
FIG. 3 illustrates a modulation circuit in accordance with some embodiments.

An exemplary embodiment of the mechanism is further described in relation to FIG. 3. As shown in this figure, an exemplary modulation circuit 300 includes a controller 305 that is coupled to a DC-DC converter 360 and a phase modulator 330, which are in turn coupled to one or more amplifiers 340. The controller 305 typically receives data at a data input 310 and control signals at a control input 315. The control signals typically include information regarding frequency, power, and other modulation parameters for the modulation circuit 300.

The controller 305 further has (polar) outputs ρ and θ. The output ρ represents the magnitude, in polar coordinate form, of an envelope or message signal received by the controller 305 at the data input 310. As described above, the output ρ is used for performing amplitude and/or envelope modulation for the message signal. Similarly, the output θ represents the phase angle of the message signal, in polar coordinate form. The output θ of the controller is used to perform phase modulation for the message signal.

One of ordinary skill will recognize that the controller 305 is representative of a robust device that includes a variety of implementation details, which vary for the specific application of the circuit 300. For instance, when the data at the data input 310 comprises an IQ signal, the controller 305 of some embodiments additionally provides for conversion of the IQ signal to the polar outputs ρ and θ. Whereas in some embodiments, the input data signal already comprises polar signals, and thus no conversion is necessary. Similarly, the data input 310 receives digital and/or analog signals in different embodiments. Regardless of whether the data signal at the data input 310 comprises an analog or a digital signal, the controller 305 provides for the necessary analog to digital and/or digital to analog conversion(s).

Moreover, the control input 315 is configured to receive application-specific information in various embodiments. For example, the received control signals include frequencies that are appropriate for use in a cellular network, a wireless network, and/or another environment having a bandwidth specification in the radio frequency broadcasting spectrum. The power requirements for different applications similarly vary in different embodiments. For example, applications in a cellular environment or in a local wireless networking environment involving the IEEE specification 802.11x, have power and control information on the order of milliwatts, while amplification on the order of kilowatts or megawatts is contemplated for higher power and/or longer range applications.

As further shown in FIG. 3, the controller 305 provides the output ρ to the DC-DC converter 360. The DC-DC converter 360 also receives a voltage input $V_{IN}$ from a voltage source 355. Then, based on the input signal $V_{IN}$ and the output ρ, the DC-DC converter 360 outputs a power signal ($V_{PA}$) to a supply input of the amplifier 340. The DC-DC converter 360 further provides a feedback signal (when $D>D_0$) to the controller 305. That is, when the duty cycle D is greater than a threshold $D_0$, the DC-DC converter 360 relates this information to the controller 305 through a feedback signal.

The input voltage $V_{IN}$ provided to the DC-DC converter 360 is typically associated with a limited and/or portable power supply 355, such as a battery, for example. Hence, the feedback signal (when $D>D_0$) is typically based on a duty cycle that is related to the input voltage $V_{IN}$ associated with the power supply, or battery.

Accordingly, the output of the DC-DC converter 360 provides a control signal $V_{PA}$, which adjusts the gain of the amplifier 340. Since, the DC-DC converter 360 also provides the feedback signal (when $D>D_0$) to the controller 305, the gain on the amplifier 340 is also controlled by the duty cycle of the DC-DC converter 360. Moreover, the duty cycle "D" depends on the relative strength of the power source 355, which supplies the input voltage $V_{IN}$ to the DC-DC converter 360.

The controller 305 provides the output phase angle θ to the phase modulator 330. The phase modulator 330 receives a phase modulation signal $ω_c$ (the carrier), applies it to the phase angle θ, and then provides the resultant phase modulated signal to the amplifier 340. As mentioned above, the amplifier 340 amplifies the received phase modulated signal based on the gain provided by the DC-DC converter 360. Hence, the output of the amplifier 340 is an amplified and phase modulated radio frequency (RF) signal that is suitable for transmission. This RF signal may then be provided to additional circuitry such as an additional amplifier for further amplification (as is the case in an amplifier module), or typically to one or more antennae 350 for transmission.

Figure 5:
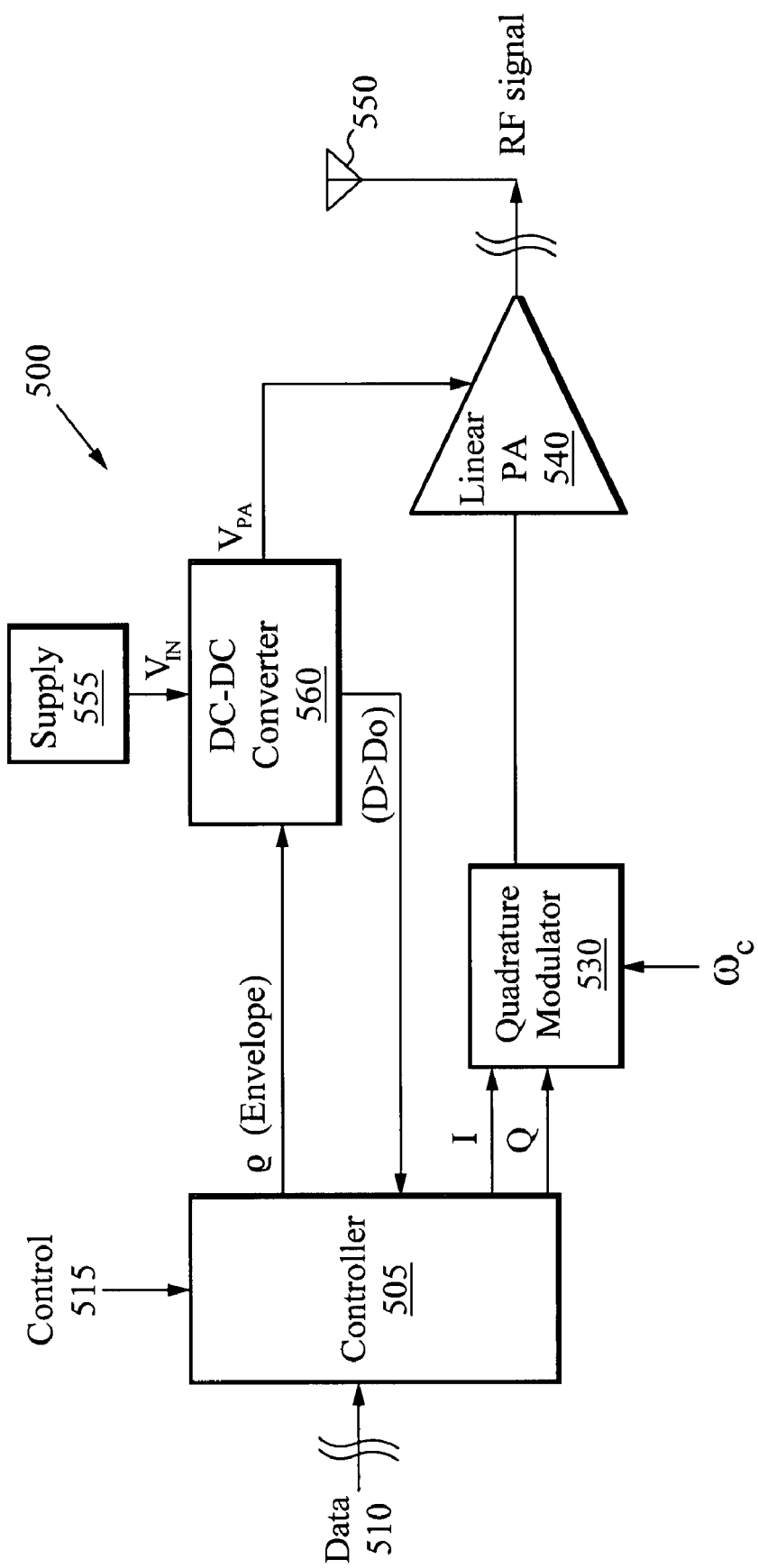
FIG. 5 illustrates a modulation circuit in accordance with some embodiments.

A further exemplary embodiment of the mechanism with a quadrature modulator instead of the phase modulator, is further described in relation to FIG. 5. As shown in this figure, an exemplary modulation circuit 500 includes a controller 505 that is coupled to a DC-DC converter 560 and a quadrature modulator 530, which are in turn coupled to one or more amplifiers 540. In some embodiments, the amplifiers 540 are linear power amplifiers. The controller 505 typically receives data at a data input 510 and control signals at a control input 515. The control signals typically include information regarding frequency, power, and other modulation parameters for the modulation circuit 500.

The controller 505 further has (quadrature) outputs I and Q. The output I represents an in-phase signal component. The output Q represents a quadrature signal component. The controller 505 also provides the output ρ, as described above, to the DC-DC converter 560.

As discussed above, one of ordinary skill will recognize that the controller 505 is representative of a robust device that includes a variety of implementation details, which vary for the specific application of the circuit 500. For instance, when the data at the data input 510 comprises an IQ signal, the controller 505 of some embodiments additionally provides for conversion of the IQ signal to at least the polar output ρ. Whereas in some embodiments, the input data signal already comprises polar signals, and thus no conversion is necessary. Similarly, the data input 510 receives digital and/or analog signals in different embodiments. Regardless of whether the data signal at the data input 510 comprises an analog or a digital signal, the controller 505 provides for the necessary analog to digital and/or digital to analog conversion(s).

Moreover, the control input 515 is configured to receive application-specific information in various embodiments. For example, the received control signals include frequencies that are appropriate for use in a cellular network, a wireless network, and/or another environment having a bandwidth specification in the radio frequency broadcasting spectrum. The power requirements for different applications similarly vary in different embodiments. For example, applications in a cellular environment or in a local wireless networking environment involving the IEEE specification 802.11x, have power and control information on the order of milliwatts, while amplification on the order of kilowatts or megawatts is contemplated for higher power and/or longer range applications.

As further shown in FIG. 5, the controller 505 provides the output ρ to the DC-DC converter 560. The DC-DC converter 560 also receives a voltage input $V_{IN}$ from a voltage source 555. Then, based on the input signal $V_{IN}$ and the output ρ, the DC-DC converter 560 outputs a power signal ($V_{PA}$) to a supply input of the amplifier 540. The DC-DC converter 560 further provides a feedback signal (when $D>D_0$) to the controller 505. That is, when the duty cycle D is greater than a threshold $D_0$, the DC-DC converter 560 relates this information to the controller 505 through a feedback signal.

The input voltage $V_{IN}$ provided to the DC-DC converter 560 is typically associated with a limited and/or portable power supply 555, such as a battery, for example. Hence, the feedback signal (when $D>D_0$) is typically based on a duty cycle that is related to the input voltage $V_{IN}$ associated with the power supply, or battery.

Accordingly, the output of the DC-DC converter 560 provides a control signal $V_{PA}$, which adjusts the power dissipated by the amplifier 540. Moreover, the duty cycle "D" depends on the relative strength of the power source 555, which supplies the input voltage $V_{IN}$ to the DC-DC converter 560.

The controller 505 provides the output signals I and Q to the quadrature modulator 530. The quadrature modulator 530 provides an input signal to the amplifier 540. As mentioned above, the amplifier 540 amplifies the received modulated signal using the power provided by the DC-DC converter 560. Hence, the output of the amplifier 540 is an amplified and modulated radio frequency (RF) signal that is suitable for transmission. This RF signal may then be provided to additional circuitry such as an additional amplifier for further amplification (as is the case in an amplifier module), or typically to one or more antennae 550 for transmission.

Figure 4:
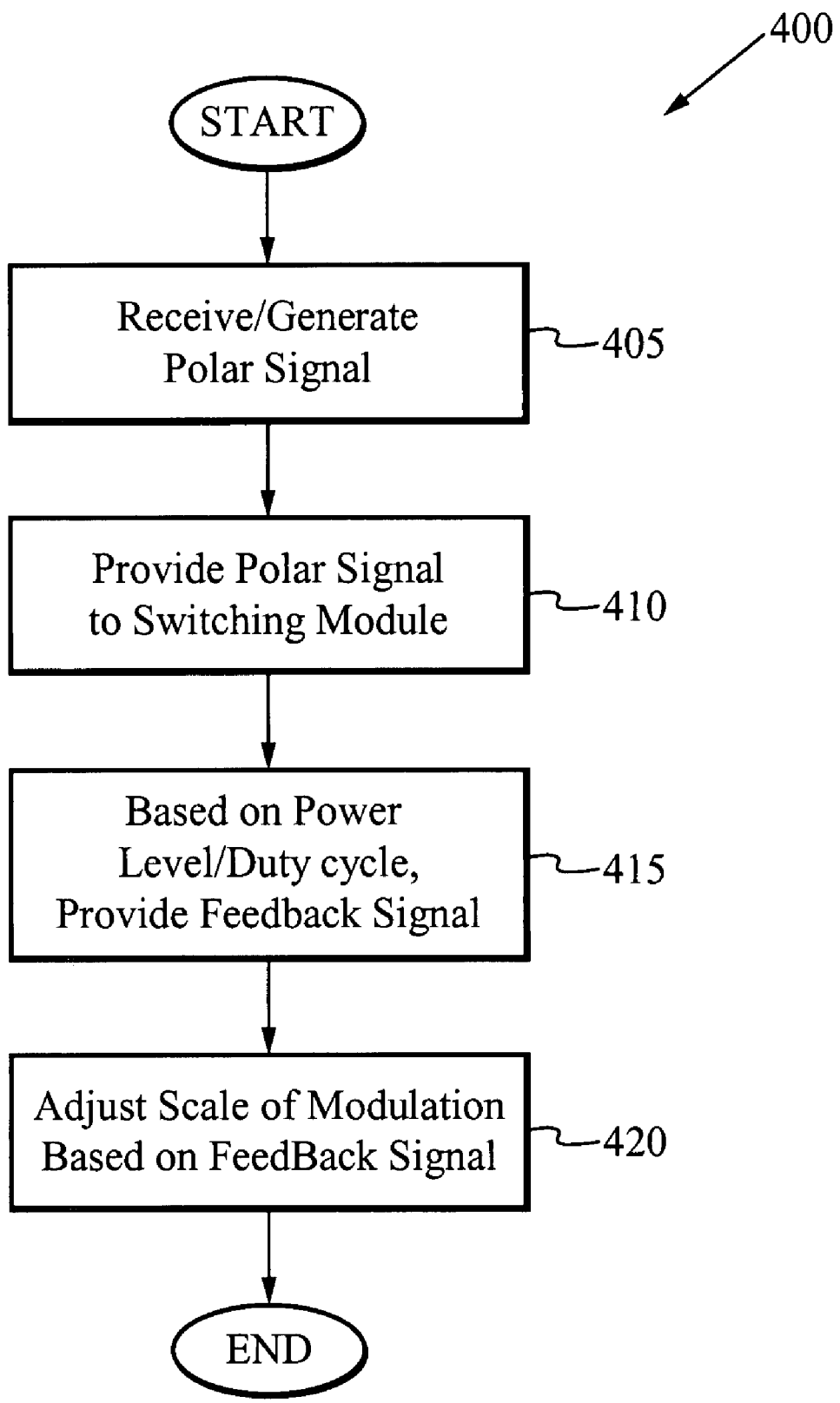
FIG. 4 illustrates a process in accordance with some embodiments.

FIG. 4 illustrates a process 400 that describes the operation of some embodiments in further detail. As shown in this figure, the process 400 begins at the step 405, where a polar signal is received. As mentioned above, some embodiments receive an input message signal in polar coordinate form, and no conversion is necessary. However, some embodiments receive an input signal that is in another form, such as, for example the quadrature (IQ) format. In these embodiments, the polar signal is generated (converted) based on the I and Q components of the input signal. Also, at the step 405, any necessary analog and/or digital conversions are performed. Preferably, the operations of receiving and/or generating the polar signal, and performing any necessary conversions are performed by a control module of some embodiments, such as, for example, the controller 305 of FIG. 3.

Regardless of whether the polar signal is received or generated, once the polar coordinates become available at the step 405, the process 400 transitions to the step 410. At the step 410, the polar signal (coordinates) are provided to a switching module.

Typically, the switching module is a device having a duty cycle, such as, for example, a DC-DC converter. The duty cycle is used, at the step 415 to provide a feedback signal. In some embodiments, the duty cycle is compared to a threshold. If the duty cycle exceeds the threshold, the feedback signal is generated to relay this information. In these embodiments, the feedback signal comprises a "backoff" signal that is sent to the control module.

In the embodiment illustrated in FIG. 3, for instance, the duty cycle "D" of the DC-DC converter 360 varies in relation to the input voltage signal $V_{IN}$ provided by the voltage source 355. More specifically, the duty cycle "D" increases as the input voltage signal $V_{IN}$ decreases. As mentioned above, the voltage source 355 is typically a limited battery. Thus, as power is consumed from the voltage source 355, then the input voltage signal $V_{IN}$ necessarily decreases and causes the duty cycle "D" of the DC-DC converter 360 to increase. When the input voltage signal $V_{IN}$ is sufficiently low, the duty cycle will exceed the predetermined threshold ($D>D_0$), and the feedback signal is generated at the step 415 of the process 400.

Accordingly, at the step 420 of the process 400, the scale of modulation is adjusted based on the feedback signal. For instance, in some embodiments the magnitude of the polar signal is reduced in response to the feedback or "backoff" signal. In the embodiments where the control module provides the polar signal, and receives the feedback signal, the control module also typically adjusts the polar signal. Additionally, any unnecessary backoff is advantageously removed from the polar signal at the step 420, by using the feedback signal, and the control module, in conjunction with a number of conventional means. Hence, the polar signal is "tuned" at the step 420 based on the input and output power (efficiency)

requirements selected for the process 400. Once the scale of modulation is adjusted at the step 420, the process 400 concludes.

Advantages

Particular embodiments of the invention have been described in relation to devices having a portable and/or limited power supply. One of ordinary skill will recognize many applications of the invention that are within this category, such as, a myriad of cellular and other radio transceiver type devices. Additional applications of the embodiments discussed above are further recognized by one of ordinary skill. Moreover, the particular field of application often dictates the type of power amplifier used, and its mode of operation.

To achieve higher levels of power efficiency, some embodiments of the invention sense, at the DC-DC converter, when the output required from the DC-DC converter is too close to the input supply power, and report this condition back to the modulation control unit in a feedback signal. The feedback signal is generated in reaction to the operating duty cycle of the DC-DC converter switches. In some embodiments, the duty cycle is directly sensed. In some embodiments, a signal or state that corresponds to or is representative of the duty cycle is sensed. An exemplary pairing of a DC-DC converter 360 and a controller 305 is discussed above in relation to FIG. 3. As also discussed above, in some embodiments, there is no phase modulation path, but instead a quadrature modulator 530 provides the input signal to the power amplifier 540. In some embodiments, the feedback signal is labeled (ModCtl) and includes modulation control information. As described above, the control unit typically responds by decreasing or lowering the scale of the envelope modulation (EM) performed by the modulation circuitry.

Some embodiments adjust the scale of modulation in other ways. For instance, some embodiments increase the scale of modulation in response to an increasing input voltage signal $V_{IN}$, which typically indicates a (re)charging power supply. These embodiments maintain and/or maximize efficiency for a further range of power conditions.

The present application has been described in terms of specific embodiments incorporating details to facilitate the understanding of the principles of construction and operation of the polar phased array digital transceiver. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

I claim:

1. A method of providing efficient signal modulation comprising:
   providing a polar signal to a switching module, the switching module having a voltage input;
   providing a feedback signal from the switching module, the feed back signal representative of a duty cycle; and
   adjusting a peak of a modulation signal based on the feedback signal.

2. The method of claim 1, wherein adjusting the peak of the modulation signal comprises modifying the polar signal.

3. The method of claim 1, further comprising generating the polar signal from an input signal.

4. The method of claim 1, further comprising amplifying the polar signal, wherein the amplification is based on the voltage input.

5. The method of claim 1, further comprising modifying a phase of the polar signal.

6. The method of claim 1, further comprising, from the polar signal, generating an RF signal for transmission.

7. The method of claim 1, wherein the voltage input indicates a low battery condition.

8. The method of claim 1, wherein the feedback signal indicates when the voltage input comprises a low signal.

9. The method of claim 1, wherein a magnitude of the polar signal is modified based on the feedback signal.

10. The method of claim 1, wherein the feedback signal provides for efficient modulation of the polar signal.

11. The method of claim 1, wherein the modulation comprises amplitude modulation.

12. The method of claim 1, wherein the modulation comprises phase modulation.

13. The method of claim 1, further comprising receiving a polar signal.

14. The method of claim 1, further comprising generating a polar signal.

15. A system for providing efficient polar signal modulation comprising:
   a controller for receiving an input and outputting a polar signal;
   a voltage converter coupled to the controller, the voltage converter for:
     receiving a magnitude component of the polar signal,
     receiving a voltage input, and
     providing a power signal;
   a phase modulator coupled to the controller, the phase modulator for:
     receiving a phase angle θ,
     receiving a phase modulation $\omega_c$, and
     providing a phase modulated signal; and
   an amplifier coupled to the voltage converter and the phase modulator, the amplifier for amplifying the phase modulated signal based on the power signal,
   wherein the voltage converter provides a feedback signal to the controller, and
   further wherein the controller adjusts a peak of a modulation signal based on the feedback signal, such that the output power and the amplification by the amplifier are based on the feedback signal.

16. The system of claim 15, wherein adjusting the peak of the modulation signal comprises modifying the polar signal.

17. The system of claim 15, wherein the controller generates the polar signal.

18. The system of claim 15, wherein the power output is based on the voltage input such that the amplification is based on the voltage input.

19. The system of claim 15, wherein the phase modulated signal is based on the phase angle θ and the phase modulation $\omega_c$.

20. The system of claim 15, wherein the system generates an RF signal for transmission.

21. The system of claim 15, wherein the voltage signal indicates a low battery condition.

22. The system of claim 15, wherein the feedback signal indicates when the voltage input is low.

23. The system of claim 15, wherein a magnitude of the polar signal is modified based on the feedback signal.

24. The system of claim 15, wherein the feedback signal provides for efficient modulation of the polar signal.

25. The system of claim 15, wherein the modulation comprises amplitude modulation.

26. The system of claim 15, wherein the modulation comprises phase modulation.

27. A system for providing efficient signal modulation comprising:
- a control module for receiving a first signal and outputting a second signal, the second signal based on the first signal;
- a power source for outputting a power level;
- a switching module coupled to the control module for receiving the second signal and coupled to the power source for receiving the power level, wherein the switching module provides a feedback signal based on the power level; and
- a modulation scale, wherein the modulation scale is adjusted based on the feedback signal.

28. The system of claim 27, wherein the modulation scale comprises a system parameter for modulation of the second signal.

29. The system of claim 27, wherein the second signal comprises polar coordinates.

30. The system of claim 27, wherein the second signal is digital.

31. The system of claim 27, wherein the first signal comprises quadrature components.

32. The system of claim 27, wherein the first signal comprises an analog signal.

33. The system of claim 27, wherein the switching module has a duty cycle based on the power level, wherein the feedback signal is based on the duty cycle.

34. The system of claim 27, wherein the switching module is driven by pulse width modulation.

35. The system of claim 27, wherein the switching module is driven by sigma-delta modulation.

36. The system of claim 27, wherein the power source is limited, the power source providing power for the system.

37. A system for providing efficient polar signal modulation comprising:
- a controller for receiving an input and outputting a polar signal;
- a voltage converter coupled to the controller, the voltage converter for:
  - receiving a magnitude component of the polar signal,
  - receiving a voltage input, and
  - providing a power signal;
- a quadrature modulator coupled to the controller, the quadrature modulator for:
  - receiving an in-phase signal I,
  - receiving a quadrature signal Q, and
  - providing a modulated signal; and
- an amplifier coupled to the voltage converter and the quadrature modulator, the amplifier for amplifying the modulated signal,
- wherein the voltage converter provides a feedback signal to the controller, and
- further wherein the controller adjusts a peak of a modulation signal based on the feedback signal, such that the output power and the amplification by the amplifier are based on the feedback signal.

38. The system of claim 37, wherein adjusting the peak of the modulation signal comprises modifying the modulation signal.

39. The system of claim 37, wherein the controller generates the in-phase signal I and the quadrature signal Q.

40. The system of claim 37, wherein power dissipation is based on the voltage input.

41. The system of claim 37, wherein the system generates an RF signal for transmission.

42. The system of claim 37, wherein the voltage signal indicates a low battery condition.

43. The system of claim 37, wherein the feedback signal indicates when the voltage input is low.

44. The system of claim 37, wherein a magnitude of the modulation signal is modified based on the feedback signal.

45. The system of claim 37, wherein the feedback signal provides for efficient modulation of the modulation signal.

46. The system of claim 37, wherein the modulation comprises amplitude modulation.

47. An apparatus comprising:
- a DC-DC converter; and
- a controller configured to provide a magnitude component signal for the DC-DC converter;
- wherein the DC-DC converter is configured to receive a voltage signal, and provides a voltage output for power amplification,
- wherein the DC-DC converter provides a feedback based on the voltage signal and the voltage output, and
- wherein the controller modifies the magnitude component signal based on the feedback.

* * * * *